United States Patent
Won

(10) Patent No.: US 6,816,416 B2
(45) Date of Patent: Nov. 9, 2004

(54) MEMORY DEVICE HAVING REDUCED LAYOUT AREA

(75) Inventor: Jong-hak Won, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 10/361,322

(22) Filed: Feb. 10, 2003

(65) Prior Publication Data

US 2003/0161250 A1 Aug. 28, 2003

(30) Foreign Application Priority Data

Feb. 22, 2002 (KR) .................................... 2002-0009573

(51) Int. Cl.[7] ............................................... G11C 7/00
(52) U.S. Cl. ..................... 365/189.02; 365/203; 365/63
(58) Field of Search ........................... 365/189.02, 203, 365/63, 230.03, 51

(56) References Cited

U.S. PATENT DOCUMENTS 6,272,062 B1 * 8/2001 Mueller et al. ......... 365/189.02

* cited by examiner

Primary Examiner—Huan Hoang
(74) Attorney, Agent, or Firm—Myers Bigel Sibley & Sajovec PA

(57) ABSTRACT

A memory device having a memory core, a local equalizer, and a local-global multiplexer. The memory core is connected to local input/output lines and global input/output lines. The local equalizer is configured to precharge the local input/output lines. The global multiplexer is configured to alternately connect and disconnect the local input/output lines with the global input/output lines. The local equalizer is in a same layer of the memory device as the local-global multiplexer.

19 Claims, 4 Drawing Sheets

MEMORY DEVICE HAVING REDUCED LAYOUT AREA

RELATED APPLICATION

This application claims the benefit of Korean Patent Application No. 2002-0009573, filed Feb. 22, 2002, the disclosure of which is hereby incorporated herein by reference in its entirety as if set forth fully herein.

FIELD OF THE INVENTION

The present invention relates to the field of semiconductor memory devices, and more particularly, to the arrangement of circuits within a memory device having local input/output lines and global input/output lines.

BACKGROUND OF THE INVENTION

How circuits are arranged in semiconductor memory devices can affect their efficiency and level of integration, or layout area. The individual size and layout of circuits within the memory device, such as within the memory core, can have a substantial affect on the overall size of the resulting memory chip when the circuits are replicated in great numbers.

FIG. 1 is a circuit diagram of a conventional memory device. FIG. 2 is a block diagram illustrating the arrangement of the conventional memory device of FIG. 1.

The conventional semiconductor memory device 100 includes a memory core 110, local input/output lines LIO and LIOB, global input/output lines GIO and GIOB, a conjunction circuit 180, and a local-global multiplexer 190. The memory core 110 includes a memory cell 120, bit line equalizers 130, a PMOS sense amplifier 140, a transmission gate circuit 150, a NMOS sense amplifier 160, and a NMOS sense amplifier driver 170 for driving the NMOS sense amplifier 160. The conjunction circuit 180 includes a local equalizer 185.

The bit line equalizer 130 is adjacent to the memory cell 120, and the PMOS sense amplifier 140 is adjacent to the bit line equalizer 130. The transmission gate circuit 150 is adjacent to the PMOS sense amplifier 140. The local-global multiplexer 190 is adjacent to the transmission gate circuit 150. The local-global multiplexer 190 is in a different semiconductor layer, that is separate, from the layer in which the transmission gate circuit 150 is formed. The local-global multiplexer 190 is under the memory core 110. As shown in FIG. 2, the local-global multiplexer 190 is adjacent to the transmission gate circuit 150. The NMOS sense amplifier 160 is adjacent to the transmission gate circuit 150, and the NMOS sense amplifier driver 170 is adjacent to the NMOS sense amplifier 160. The bit line equalizer 130 is adjacent to the NMOS sense amplifier driver 170.

As shown in FIGS. 1 and 2, the local equalizer 185 is within the conjunction circuit 180. Accordingly, the circuitry of the local equalizer 185 and the conjunction circuit 180 may compete, during layout, for the same limited area within a layer and, during operation, the power available for the circuits and associated signal intensities may be reduced.

SUMMARY OF THE INVENTION

Some embodiments of the present invention provide a memory device having a memory core, a local equalizer, and a local-global multiplexer. The memory core is connected to local input/output lines and global input/output lines. The local equalizer is configured to precharge the local input/output lines. The global multiplexer is configured to alternately connect and disconnect the local input/output lines with the global input/output lines. The local equalizer is in a same layer of the memory device as the local-global multiplexer. Accordingly, during layout, area set aside on the layer used for the local-global multiplexer may also be used for the layout of the local equalizer, which may reduce the overall layout area of the memory device.

According to other embodiments of the present invention, the memory device further includes a conjunction circuit and a polysilicon layer. The conjunction circuit is adjacent to the local equalizer, and is configured to control the memory core. The polysilicon layer extends between the conjunction circuit and the local equalizer to conduct a gate control signal therebetween. Accordingly, with the conjunction circuit adjacent to the local equalizer, a polysilicon layer may be used to conduct a gate control signal therebetween.

According to yet other embodiments of the present invention, a memory device includes a local equalizer, a local-global multiplexer, and a sense amplifier driver. The local equalizer is configured to precharge local input/output lines. The local-global multiplexer is configured to alternately connect and disconnect the local input/output lines with global input/output lines. The sense amplifier driver is configured to drive a sense amplifier, and is in a same layer of the memory device as the local equalizer and the local-global multiplexer. Accordingly, during layout, area set aside on the layer used for the local-global multiplexer may also be used for the layout of the sense amplifier driver and the local equalizer, which may reduce the overall layout area of the memory device.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
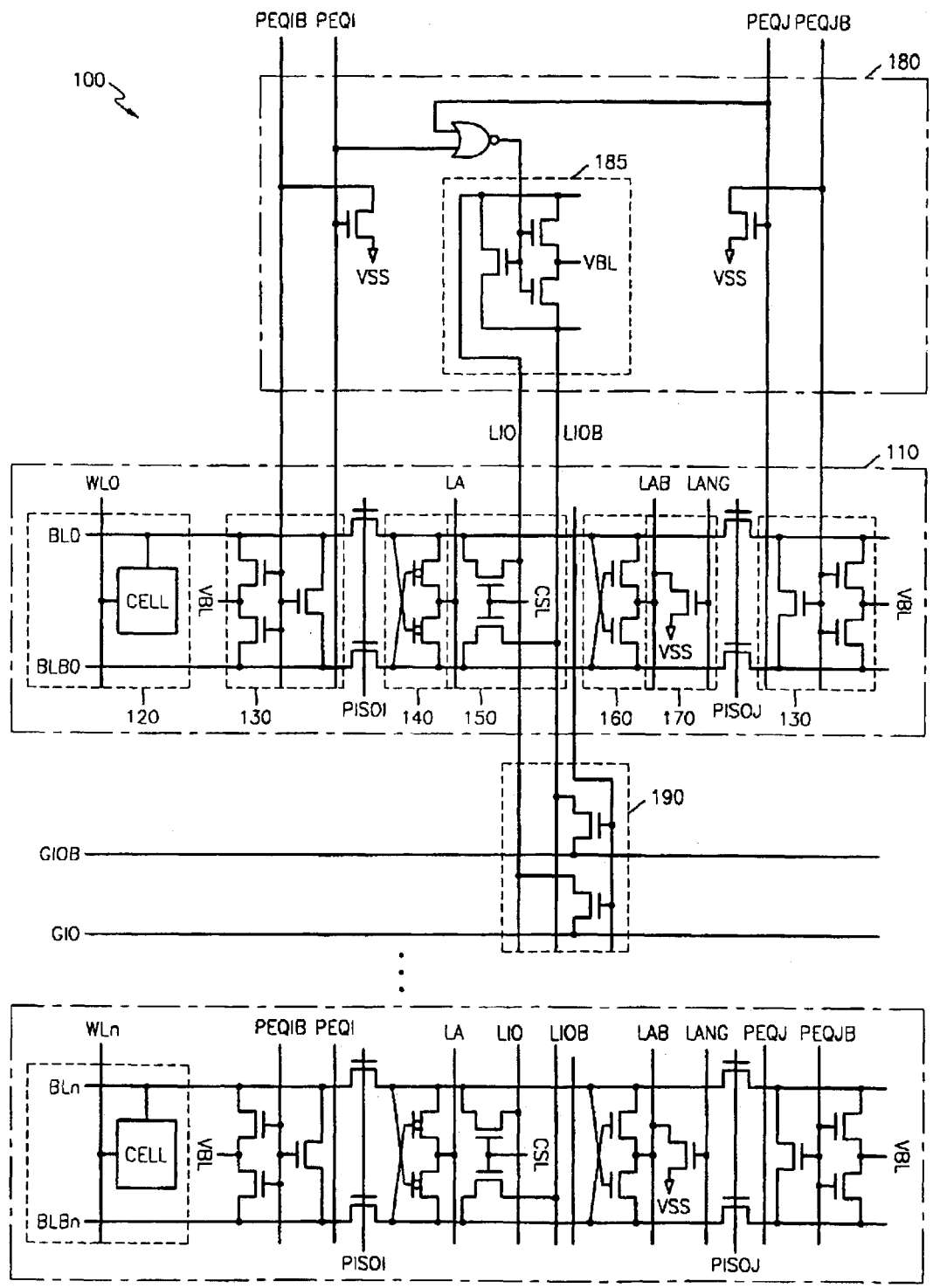
FIG. 1 is a circuit diagram of a conventional semiconductor memory device.
Figure 2:
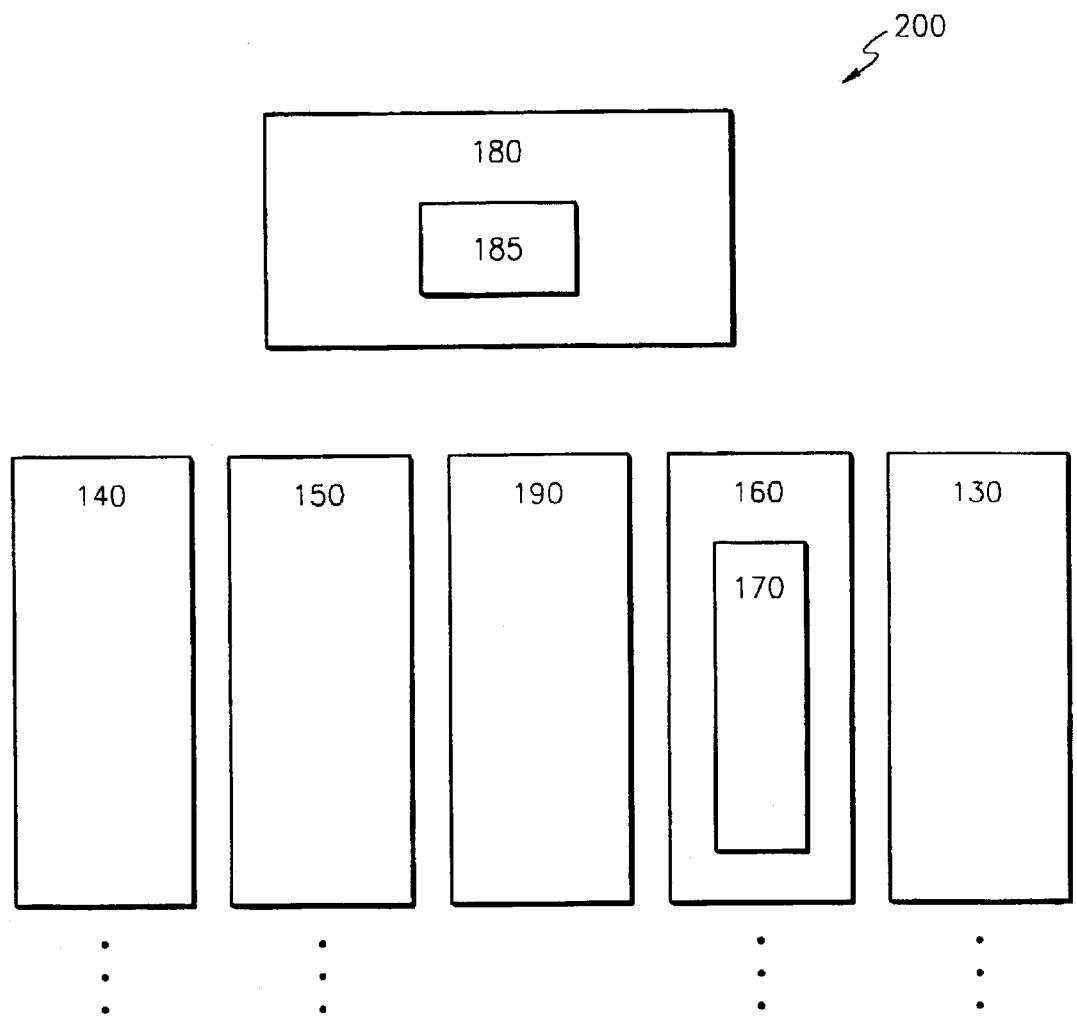
FIG. 2 is a block diagram illustrating the arrangement of the conventional memory device of FIG. 1.

The present invention now will be described more fully hereinafter with reference to the accompanying figures, in which embodiments of the invention are shown. This invention should not be construed as limited to the embodiments set forth herein. Accordingly, specific embodiments thereof are shown by way of example in the drawings and will herein be described in detail. It should be understood, however, that there is no intent to limit the invention to the particular forms disclosed. Like numbers refer to like elements throughout the description of the figures.

Figure 3:
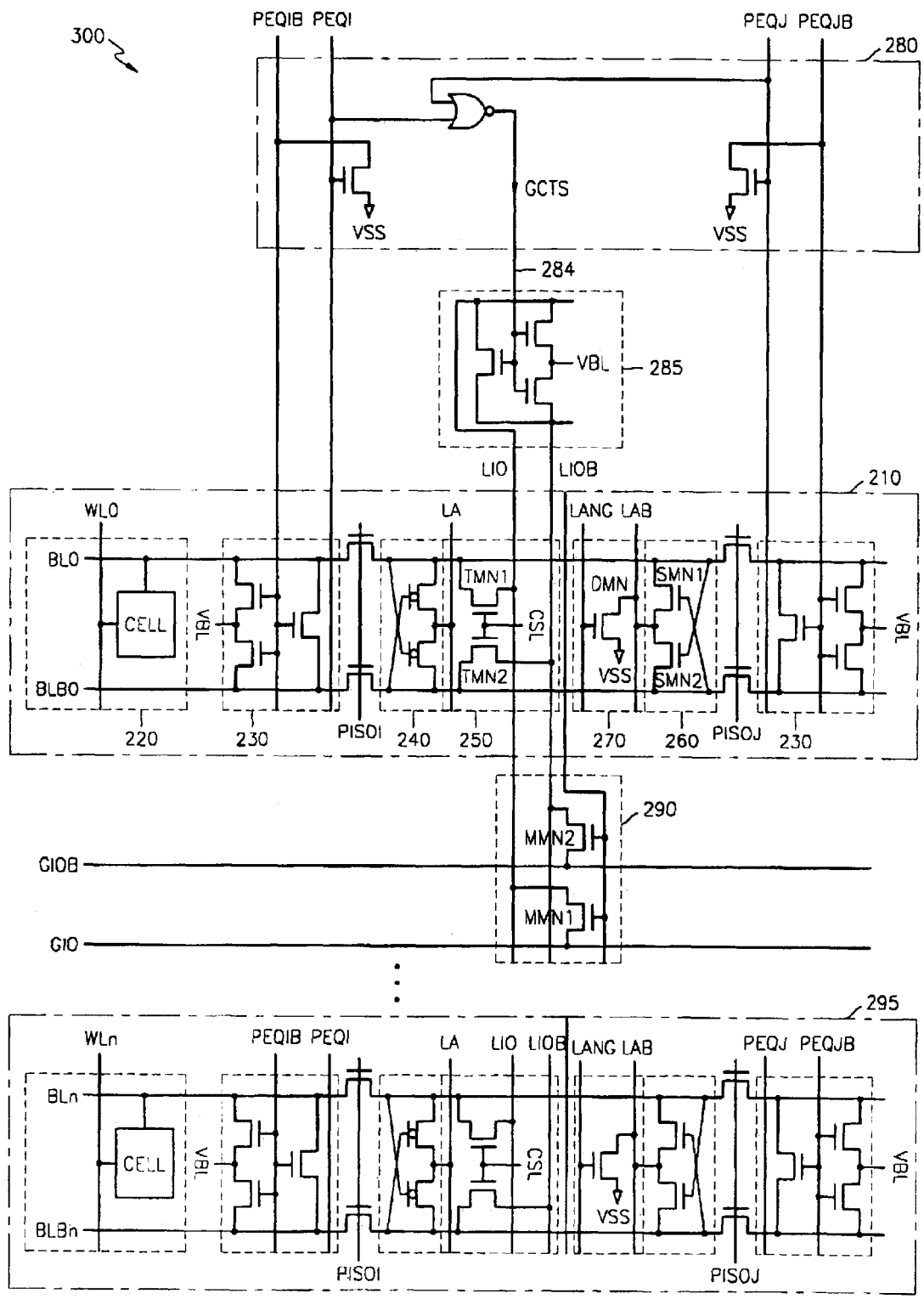
FIG. 3 is a circuit diagram of a memory device according to embodiments of the present invention.
Figure 4:
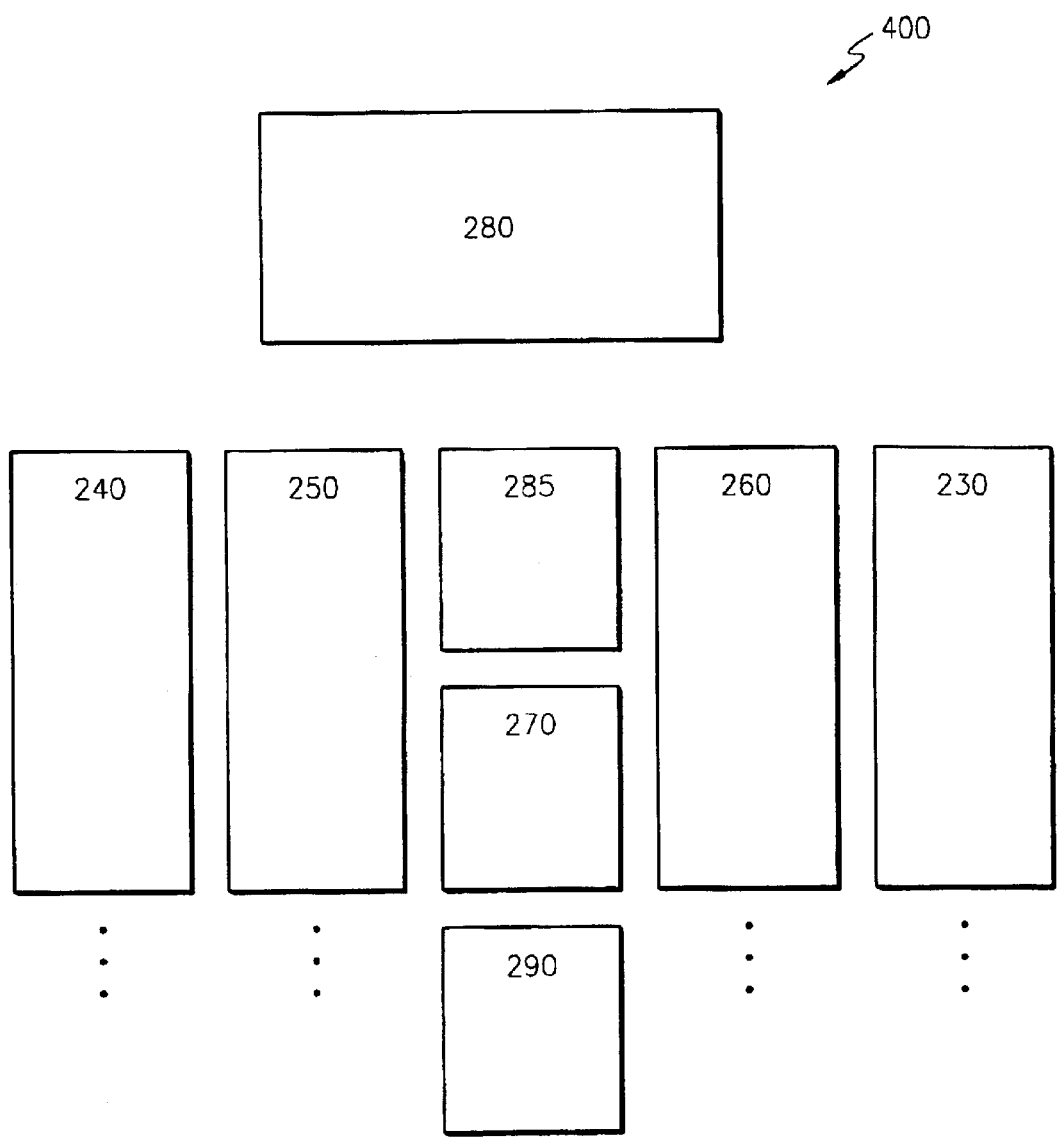
FIG. 4 is a block diagram illustrating the arrangement of the memory device of FIG. 3 according to embodiments of the present invention.

FIG. 3 is a circuit diagram of a memory device having local input/output lines and global input/output lines according to embodiments of the present invention. FIG. 4 is a block diagram that illustrates the arrangement of a memory device, such as that shown in FIG. 3, according to embodiments of the present invention.

Referring to FIGS. 3 and 4, a memory device 300 according to embodiments of the present invention includes a memory core 210, local input/output lines LIO and LIOB, global input/output lines GIO and GIOB, a conjunction circuit 280, a local equalizer 285 for precharging the local input/output lines LIO and LIOB, and a local-global multiplexer 290 for performing a switching operation of connecting the local input/output lines LIO and LIOB to the global input/output lines GIO and GIOB. The memory core 210 includes a memory cell 220, bit line equalizers 230, a PMOS sense amplifier 240, a transmission gate circuit 250, a NMOS sense amplifier 260, and a NMOS sense amplifier driver 270 for driving the NMOS sense amplifier 260.

According to embodiments of the present invention, the local equalizer 285 is in the same semiconductor layer of the memory device 300 as the local-global multiplexer 290. According to still further embodiments of the present invention, the local equalizer 285 is adjacent to the conjunction circuit 280, which controls the memory core 210. A polysilicon layer 284 extends between the conjunction circuit 280 with the local equalizer 285 to conduct a gate control signal GCTS therebetween.

A first transistor TMN1 of the transmission gate circuit 250 has one end connected to a first local input/output line LIO of the local input/output lines LIO and LIOB, and another end connected to a bit line BL0. A second transistor TMN2 of the transmission gate circuit 250 has one end connected to a second local input/output line LIOB of the local input/output lines LIO and LIOB, and another end connected to a complementary bit line BLB0.

A first transistor MMN1 of the local-global multiplexer 290 has one end connected to a first global input/output line GIO of the global input/output lines GIO and GIOB, and another end connected to the first local input/output line LIO. A second transistor MMN2 of the local-global multiplexer 290 has one end connected to a second global input/output line GIOB of the global input/output lines GIO and GIOB, and another end connected to the second local input/output line LIOB.

The local equalizer 285 is configured to maintain the local input/output lines LIO and LIOB to a precharge level VBL when the memory cell 220 is precharged, to turn off the precharging operation of the local input/output lines LIO and LIOB when the memory cell 220 is enabled, and to equalize the local input/output lines LIO and LIOB for writing data into, or reading data from, the memory cell 220.

The local-global multiplexer 290 is configured to perform a switching operation between the local input/output lines LIO and LIOB and the global input/output lines GIO and GIOB. The number of local-global multiplexers 290 may correspond to the number of input/output buses of the memory core 210, and an associated layout area is thereby used for the local-global multiplexers.

According to some embodiments of the present invention, the local equalizer 285 and the local-global multiplexer 290 are in the same semiconductor layer of the memory device 300. The layer in which the local equalizer 285 and the local-global multiplexer 290 are formed may be different than the layer in which the conjunction circuit 280 is formed. The local equalizer 285 may be adjacent to the conjunction circuit 280 for controlling the memory core 210. The gate control signal GCTS may be conducted from the conjunction circuit 280 to the local equalizer 285 via the polysilicon layer 284, to control the local equalizer 285. Using a polysilicon layer to connect the adjacent local equalizer 285 and the conjunction circuit 280 may be advantageous. The polysilicon layer 284 can conduct the gate control signal GCTS while being electrically isolated from other signal lines. If the gate control signal GCTS were conducted through a metal layer from the conjunction circuit 280 to the local equalizer 285, the pitch of the metal layer may inhibit the reduction of the layout area of the circuit. According to other embodiments of the present invention, materials other than polysilicon, and other than metal, that provide electrical isolation from other signal lines may be used. In this manner, the layout area associated with a metal layer in the circuit may be reduced.

According to some embodiments of the present invention, the local input/output lines LIO and LIOB may be connected to the global input/output lines GIO and GIOB as described below. The first transistor TMN1 of the transmission gate circuit 250 may have one end connected to a first local input/output line LIO of the local input/output lines LIO and LIOB, and another end connected to the bit line BL0. The second transistor MMN2 of the transmission gate circuit 250 may have one end connected to a second local input/output line LIOB of the local input/output lines LIO and LIOB and another end connected to the complementary bit line BLB0.

Gates of the first transistor TMN1 and the second transistor TMN2 are connected to each other, and a column select signal CSL is applied to the gates of the first transistor TMN1 and the second transistor TMN2.

The first transistor MMN1 of the local-global multiplexer 290 has one end connected to the first global input/output line GIO of the global input/output lines GIO and GIOB, and another end connected to the first local input/output line LIO. The second transistor MMN2 of the local-global multiplexer 290 has one end connected to the second global input/output line GIOB of the global input/output lines GIO and GIOB, and another end connected to the second local input/output line LIOB. Gates of the first transistor MMN1 and the second transistor MMN2 of the local-global multiplexer 290 are connected to each other.

By arranging the local equalizer 285 adjacent to the conjunction circuit 280, and by placing the local equalizer 285 in the same layer of the memory device 300 as the local-global multiplexer 290, the gate control signal GCTS can be transmitted to the local equalizer 285 using a layer other than the metal layer. Accordingly, the layout area associated with the metal layer can be reduced. Additionally, the area set aside for the layout of the local-global multiplexer 290 may be further used for the layout of the local equalizer 285. Moreover, the configuration of the conjunction circuit 280 may be simplified.

According to other embodiments of the present invention, the NMOS sense amplifier driver 270 is in a same layer of the memory device 300 as the local-global multiplexer 290. Accordingly, during layout, area set aside on the layer used for the local-global multiplexer 290 may also be used for the layout of the NMOS sense amplifier driver 270, which may reduce the layout area for the memory core 210.

The NMOS sense amplifier driver 270 includes a transistor DMN having a first end connected to a connection node N1 of the first and second NMOS transistors SMN1 and SMN2 of the NMOS sense amplifier 260, a second end connected to a ground voltage VSS, and a third end connected to a drive signal LANG of the NMOS sense amplifier 260. The first and second NMOS transistors SMN1 and SMN2 are cross-coupled. The NMOS sense amplifier 260 may be adjacent to the transmission gate circuit 250. The layout area may be further reduced by arranging the NMOS sense amplifier 270 adjacent to the local-global multiplexer 290, and in the same layer of the memory device 300.

According to other embodiments of the present invention, the local equalizer 285 and the NMOS sense amplifier driver 270 are in a same layer of the memory device 300 as the local-global multiplexer 290.

The local equalizer 285 may be adjacent to the conjunction circuit 280 for controlling the memory core 210, and the NMOS sense amplifier driver 270 may be between the local equalizer 285 and the local-global multiplexer 290. The gate control signal GCTS is conducted through the polysilicon layer 284 from the conjunction circuit 280 to the local equalizer 285.

The local equalizer 285 is adjacent to the conjunction circuit 280 in the same layer as the local-global multiplexer 290, and the NMOS sense amplifier driver 270 is between the local equalizer 285 and the local-global multiplexer 290. By arranging the local equalizer 285 adjacent to the conjunction circuit 280, the gate control signal GCTS by which the local equalizer 285 is controlled, can be applied to the local equalizer 285 using a polysilicon layer instead of a metal layer. Accordingly, the area needed for a metal layer can be reduced. According to other embodiments of the present invention, the gate control signal GCTS can be applied to the local equalizer 285 using a material other than polysilicon or metal, in which electricity does not flow through other signal lines.

According to other embodiments of the present invention, the NMOS sense amplifier driver 270 can be adjacent to the conjunction circuit 280 for controlling the memory core 210. The local equalizer 285 is between the NMOS sense amplifier driver 270 and the local-global multiplexer 290.

By forming the NMOS sense amplifier driver 270 and the local equalizer 285 in the area associated with the local-global multiplexer 290, the area of the memory core 210 may be reduced, and the arrangement of the conjunction circuit 280 may be simplified.

While this invention has been particularly shown and described with reference to embodiments thereof, it will be understood by those skilled in the art that various changes in form and details may be made therein without departing from the spirit and scope of the invention as defined by the appended claims.

What is claimed is:

1. A memory device comprising:
    a memory core connected to local input/output lines and global input/output lines;
    a local equalizer that is configured to precharge the local input/output lines; and
    a local-global multiplexer that is configured to alternately connect and disconnect the local input/output lines with the global input/output lines, wherein the local equalizer is in a same layer of the memory device as the local-global multiplexer.

2. The memory device of claim 1, further comprising:
    a conjunction circuit, that is adjacent to the local equalizer, and that is configured to control the memory core; and
    a polysilicon layer that extends between the conjunction circuit and the local equalizer to conduct a gate control signal therebetween.

3. The memory device of claim 1, further comprising a transmission gate circuit, the transmission gate circuit comprising a first transistor and a second transistor, wherein the first transistor is connected between a first local input/output line of the local input/output lines and a bit line, and the second transistor is connected between a second local input/output line of the local input/output lines and a complementary bit line.

4. The memory device of claim 1, wherein the local-global multiplexer comprises a first transistor and a second transistor, the first transistor is connected between a first global input/output line of the global input/output lines and a first local input/output line of the local input/output lines, and the second transistor is connected between a second global input/output line of the global input/output lines and a second local input/output line of the local input/output lines.

5. A memory device comprising:
    a memory core connected to local input/output lines and global input/output lines;
    a local equalizer that is configured to precharge the local input/output lines;
    a local-global multiplexer that is configured to alternately connect and disconnect the local input/output lines with the global input/output lines; and
    a sense amplifier driver that is in a same layer of the memory device as the local-global multiplexer.

6. The memory device of claim 5, further comprising a sense amplifier, the sense amplifier driver is configured to drive the sense amplifier, the sense amplifier comprising first and second transistors that are cross-coupled with a connection node therebetween, the sense amplifier driver comprising a third transistor connected to the connection node, a ground voltage, and a drive signal.

7. A memory device comprising:
    a local equalizer that is configured to precharge local input/output lines;
    a local-global multiplexer that is configured to alternately connect and disconnect the local input/output lines with global input/output lines; and
    a sense amplifier driver that is configured to drive a sense amplifier, wherein the sense amplifier driver is in a same layer of the memory device as the local equalizer and the local-global multiplexer.

8. The memory device of claim 7, further comprising:
    a memory core connected to the local input/output lines and the global input/output lines; and
    a conjunction circuit, that is adjacent to the local equalizer, and that is configured to control the memory core,
    wherein the sense amplifier driver is between the local equalizer and the local-global multiplexer.

9. The memory device of claim 8, further comprising:
    a polysilicon layer that extends between the conjunction circuit and the local equalizer to conduct a gate control signal therebetween.

10. The memory device of claim 7, further comprising a transmission gate circuit, the transmission gate circuit comprising a first transistor and a second transistor, wherein the first transistor is connected between a first local input/output line of the local input/output lines and a bit line, and the second transistor is connected between a second local input/output line of the local input/output lines and a complementary bit line.

11. The memory device of claim 7, wherein the local-global multiplexer comprises a first transistor and a second transistor, the first transistor is connected between a first global input/output line of the global input/output lines and a first local input/output line of the local input/output lines, and the second transistor is connected between a second global input/output line of the global input/output lines and a second local input/output line of the local input/output lines.

12. The memory device of claim 7, wherein the sense amplifier comprising first and second transistors that are cross-coupled with a connection node therebetween, the sense amplifier driver comprising a third transistor connected to the connection node, a ground voltage, and a drive signal.

13. The memory device of claim 7, further comprising:
a memory core connected to the local input/output lines and the global input/output lines;
a conjunction circuit, that is adjacent to the sense amplifier driver, and that is configured to control the memory core; and
wherein the local equalizer is between the sense amplifier driver and the local-global multiplexer.

14. The memory device of claim 13, further comprising:
a polysilicon layer that extends between the conjunction circuit and the local equalizer to conduct a gate control signal therebetween.

15. A memory device comprising:
a local equalizer that is configured to precharge local input/output lines;
a local-global multiplexer that is configured to alternately connect and disconnect the local input/output lines with global input/output lines;
a transmission gate circuit;
a sense amplifier;
a sense amplifier driver that is configured to drive the sense amplifier, wherein the sense amplifier driver is between the transmission gate circuit and the sense amplifier wherein the local equalizer and the sense amplifier driver are in a same layer of the memory device as the local-global multiplexer.

16. The memory device of claim 15, wherein the local equalizer and the local-global multiplexer are on opposite sides of the sense amplifier driver.

17. The memory device of claim 15, further comprising a conjunction circuit, wherein the local equalizer is between the conjunction circuit and the sense amplifier driver.

18. A memory device comprising:
a local equalizer that is configured to precharge local input/output lines;
a local-global multiplexer that is configured to alternately connect and disconnect the local input/output lines with global input/output lines;
a transmission gate circuit;
a sense amplifier;
a sense amplifier driver that is configured to drive the sense amplifier, wherein the sense amplifier driver is between the transmission gate circuit and the sense amplifier, wherein the sense amplifier and the local-global multiplexer are in the same layer of the memory device.

19. The memory device of claim 18, further comprising:
a conjunction circuit; and
a polysilicon layer that is configured to conduct a gate control signal from the conjuction circuit to the local equalizer.

* * * * *